United States Patent [19]

Toriwaki et al.

[11] Patent Number: 4,799,284
[45] Date of Patent: Jan. 24, 1989

[54] PLATE CLEANING APPARATUS AND CLEANING ROLLER THEREFOR

[75] Inventors: Masao Toriwaki, Otsu; Kinya Kawakami, Mitaka; Tomoaki Ishino, Funabashi, all of Japan

[73] Assignee: Toyo Netsu Kogyo Kaisha, Ltd., Tokyo, Japan

[21] Appl. No.: 171,468

[22] Filed: Mar. 21, 1988

Related U.S. Application Data

[62] Division of Ser. No. 038,827, Apr. 15, 1987.

[30] Foreign Application Priority Data

Jun. 11, 1986 [JP] Japan .................................. 61-133700
Jun. 11, 1986 [JP] Japan .................................. 61-87746

[51] Int. Cl.$^4$ .............................................. B08B 1/02
[52] U.S. Cl. .................................. 15/230.12; 156/293; 428/65; 428/906
[58] Field of Search ................. 15/230.12, 230.14; 156/293, 294; 428/65, 906

[56] References Cited

U.S. PATENT DOCUMENTS

| 2,532,248 | 11/1950 | Upper et al. | 15/230.12 |
| 2,795,002 | 6/1957 | Davies | 15/230.12 |
| 3,023,550 | 3/1962 | Kristofik | 15/230.12 |
| 4,378,610 | 4/1983 | Ermer et al. | 15/1.5 R |
| 4,437,271 | 3/1984 | McAvoy | 15/230.12 |
| 4,497,081 | 2/1985 | Hecke et al. | 15/102 |
| 4,536,909 | 8/1985 | Bürger et al. | 15/4 |
| 4,536,911 | 8/1985 | Demetriades | 15/230.12 |
| 4,599,761 | 7/1986 | Stahl | 15/230.12 |

FOREIGN PATENT DOCUMENTS

61-230390 10/1986 Japan.

*Primary Examiner*—Chris K. Moore
*Attorney, Agent, or Firm*—Wenderoth, Lind & Ponack

[57] ABSTRACT

A plate cleaning apparatus comprising a pair of cleaning means disposed above and beneath a passageway of the plate, a first pair of nozzles and a second pair of nozzles for emitting high speed clean air streams, a clean zone for supplying gentle breeze clean air, and feed rollers for advancing the plate. A cleaning roller comprising a plurality of thin discs of nonwoven fabric bonded side by side with adhesive, and a longitudinal shaft extending through central holes in the thin discs.

1 Claim, 5 Drawing Sheets

PLATE CLEANING APPARATUS AND CLEANING ROLLER THEREFOR

This application is a divisional of Application Ser. No. 38,827, filed Apr. 15, 1987.

BACKGROUND OF THE INVENTION

This invention relates to a plate cleaning apparatus and a cleaning roller therefor both arranged in a production line of miscellaneous plates such as resin plate, glass plate and printed circuit plate.

A conventional plate cleaning apparatus for removing dust from a surface of a plate is provided with a cleaning roller and air stream supplying nozzles. In Japanese Patent Public Disclosure No. 230390/86 issued on Oct. 14, 1986, there is disclosed a dust eliminating apparatus for printed circuit plates employing a roller brush, air supplying nozzles and a dust eliminating ion generator.

The plate cleaning apparatus presently in use, however, is confronted with a problem that a swirl is produced nearby the surface of the plate thereby entraining a dust and directing it to the surface again. As a result, the dust is not effectively removed from the plate. Another problem is the fact that high speed air stream entraining a dust is exhausted from the apparatus, so that external air becomes contaminated by the dust. This is particularly a serious problem because this type of apparatus is often utilized in a clean room for processing electronic components.

Another aspect of the present invention is directed to a cleaning roller utilized in above-described plate cleaning apparatus. A conventional cleaning roller comprises a longitudinal shaft, a rubber core wound around the shaft and a nonwoven fabric cylindrical cover for contacting with a plate. Such conventional roller has a drawback that a particle of dust tends to fall off the surface of the roller and sticks to the plate again. Another drawback is that the elasticity of the rubber core is so high that the nonwoven fabric is easily worn out and the life of the roller is considerably short. As the roller is worn out its surface becomes uneven, so that the plate is not evenly cleaned.

SUMMARY OF THE INVENTION

It is an object of the present invention to provide a plate cleaning apparatus which can diminish the swirl produced nearby the plate so as to prevent a dust from sticking to the plate again.

It is another object of the present invention to provide a plate cleaning apparatus which can prevent a dust from leaving the apparatus so as to maintain the clean level of the external atmosphere.

The foregoing and other objects of the invention are accomplished by providing a plate cleaning apparatus comprising a pair of cleaning means disposed above and beneath a passageway of the plate, a first pair of nozzles disposed above and beneath the passageway at the upstream side adjacent said cleaning means, said first pair of nozzles directing high speed clean air angularly forward along the moving direction of the plate, a second pair of nozzles disposed above and beneath the passageway at the downstream side adjacent said cleaning means, said second pair of nozzles directing high speed clean air angularly backward against the moving direction of the plate, a clean zone disposed immediately after the second pair of nozzles for supplying gentle breeze clean air, and feed rollers for advancing the plate disposed outside an area between said first pair of nozzles and said second pair of nozzles. All of the high speed clean air and gentle breeze clean air are circulated by a blower and passed through a high efficiency particulate filter (referred as "HEPA filter" hereinunder). Each cleaning means is accommodated within a suction chamber leading to the HEPA filter.

Accordingly, the high speed air streams are directed to the plate and cleaning means, and then introduced into the suction chambers leading to the HEPA filter, whereby the dust leaving the plate does not return to the plate. Since the plate goes out the apparatus through the clean zone, the majority of the dust is not emitted from the apparatus.

It is a further object of the present invention to provide a cleaning roller adapted for use in a plate cleaning apparatus in such a way that the roller can eliminate the drawbacks of prior art.

The above object of the invention is accomplished by providing a cleaning roller comprising a plurality of thin discs of nonwoven fabric bonded side by side with adhesive therebetween, said adhesive having substantially the same softness before it is applied to the nonwoven fabric, and a longitudinal shaft extending through central holes provided in said thin discs. The shaft and the nonwoven fabric are bonded together by the adhesive. Thus, the cleaning roller of the invention maintains its softness and continuously provides even cleaning surface while in use.

Other objects, features and advantages of the invention will become apparent from a reading of the specification, when taken in conjunction with the drawings, in which like reference numerals refer to like elements in the several views.

DESCRIPTION OF THE PREFERRED EMBODIMENT

Figure 3:
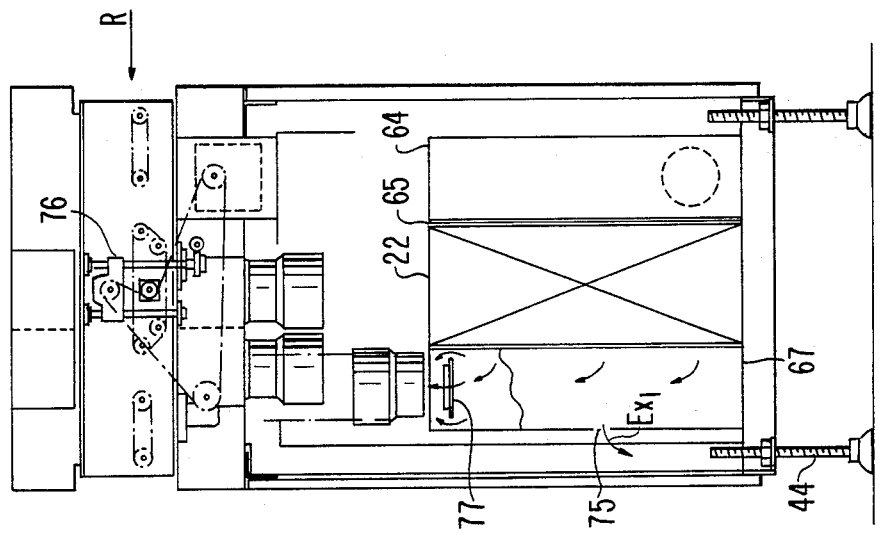
FIG. 3 is a vertical sectional view taken along the lines III—III of FIG. 1.
Figure 4:
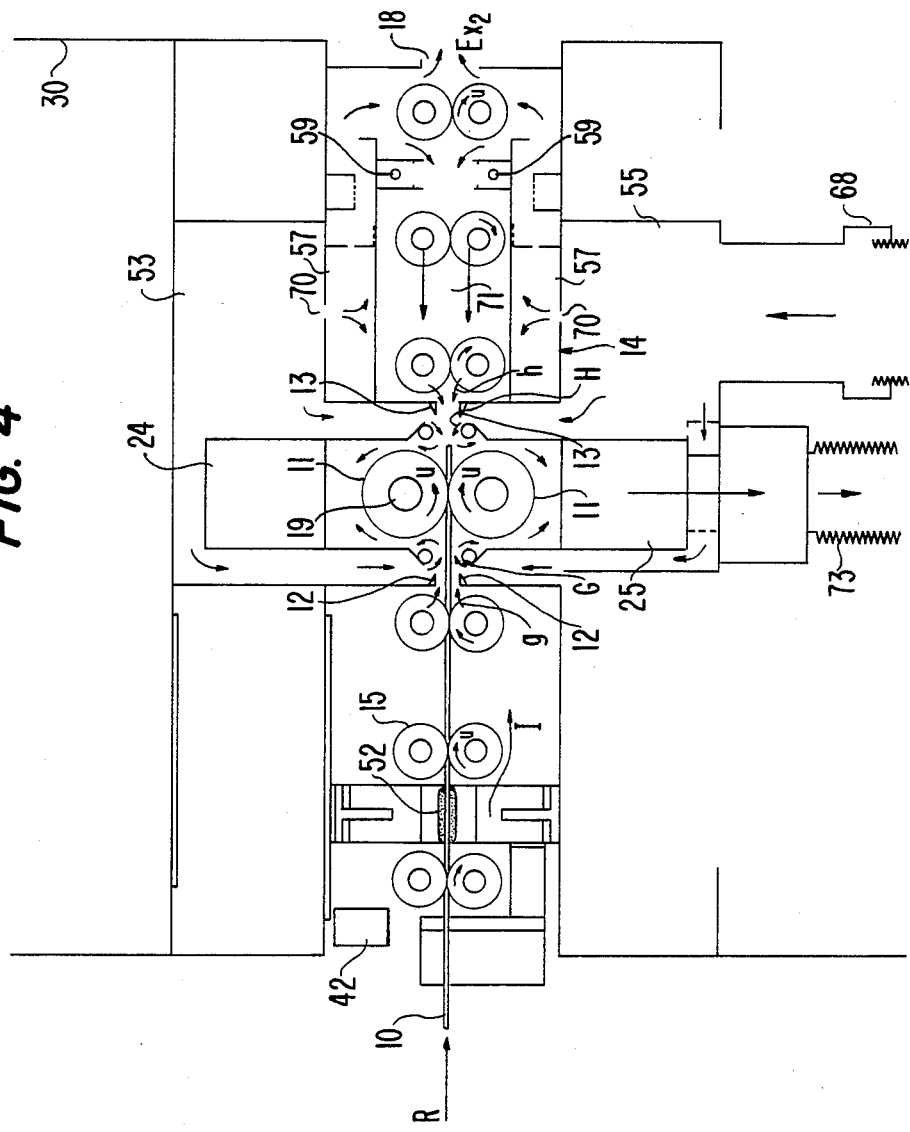
FIG. 4 is an enlarged sectional view of the upper portion of FIG. 2.
Figure 5:
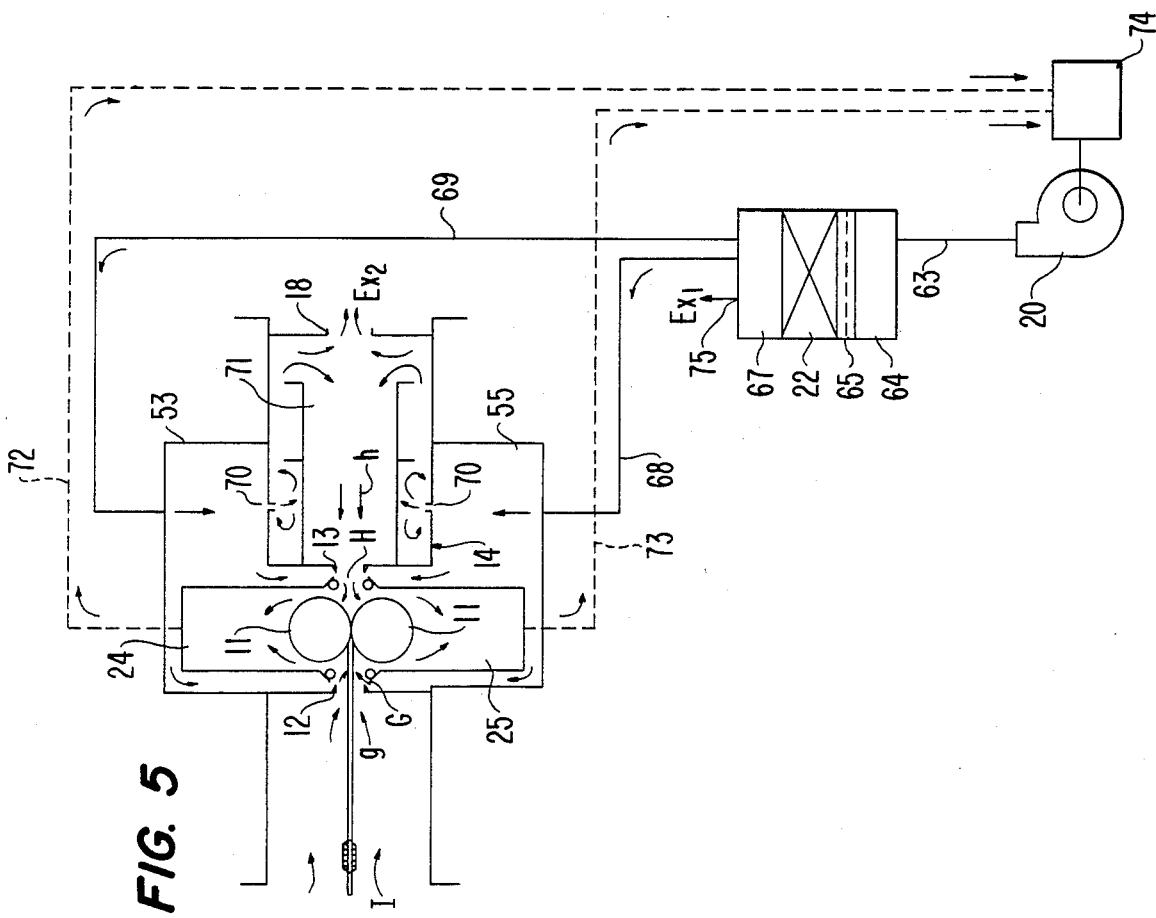
FIG. 5 is an air flow diagram of the apparatus in FIG. 1.

Referring to FIGS. 1 to 5, there is shown a plate cleaning apparatus which embodies one form of the invention. The apparatus includes a housing 30, a pair of cleaning rollers 11 disposed above and beneath a passageway of a plate 10, a first pair of nozzles 12 disposed above and beneath the passageway at the upstream side adjacent the cleaning rollers 11, a second pair of nozzles 13 disposed above and beneath the passageway at the downstream side adjacent the cleaning rollers 11, a clean zone 14 disposed immediately after the second pair of nozzles 13, and a plurality of feed rollers 15 for advancing the plate 10. The first pair of nozzles 12 emits high speed clean air stream G angularly forward along the moving direction R of the plate 10, and the second pair of nozzles 13 emits high speed clean air stream H angularly backward against the moving direction of the plate 10. The clean zone 14 is filled with gentle breeze clean air and a portion of the air flows out from the outlet 18. All the feed rollers 15 are disposed outside an area between the first pair of nozzles 12 and the second pair of nozzles 13. The high speed clean air and the gentle breeze clean air are circulated by a turbo blower 20 and are passed through a HEPA filter 22. The cleaning rollers 11 are accommodated within suction chambers 24 and 25 which are connected to the HEPA filter 22 through hose ducts 72 and 73 (FIG. 5).

Figure 1:
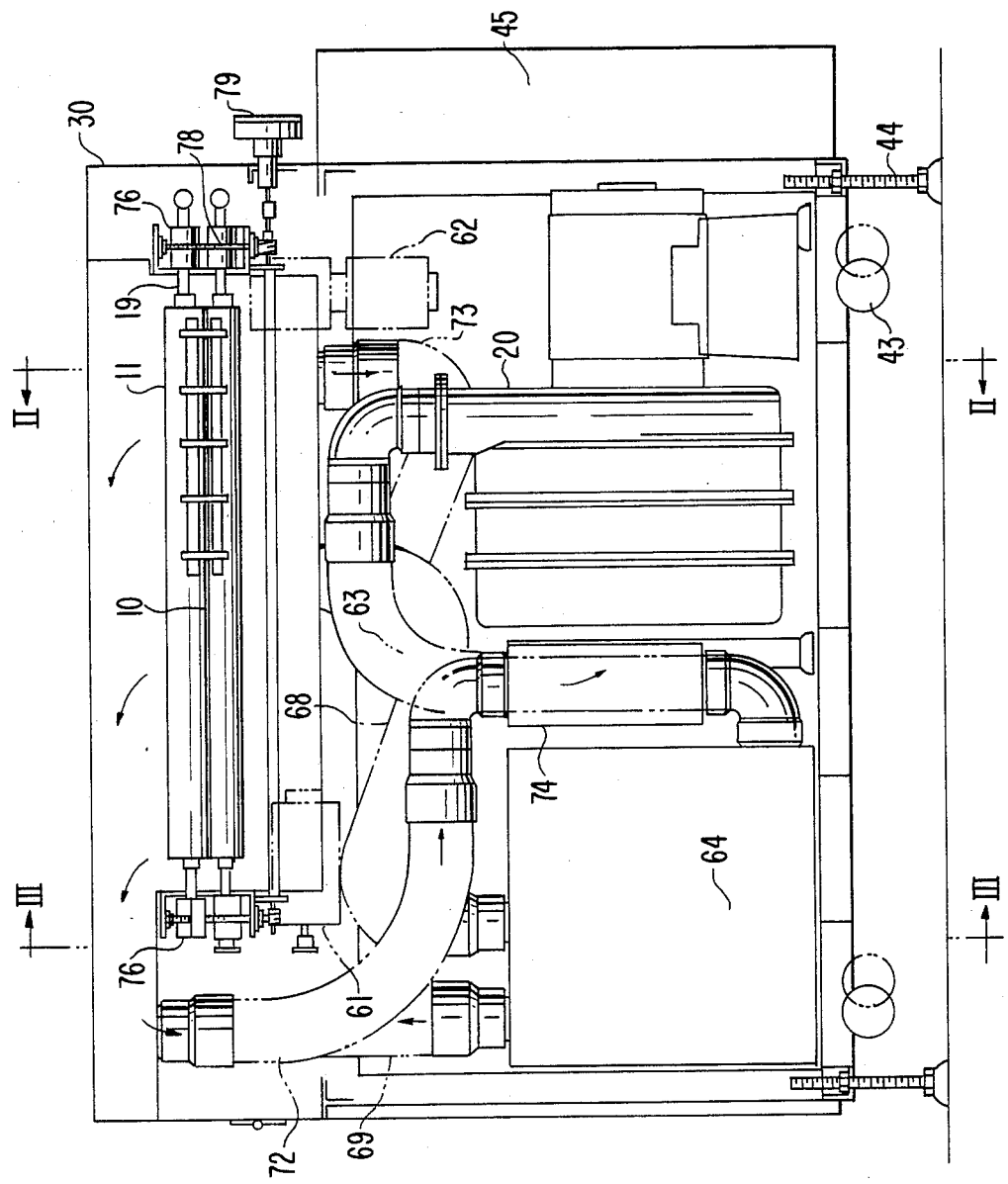
FIG. 1 is a side elevational view of a first embodiment of the plate cleaning apparatus according to the invention.

In FIG. 1, there are shown several attachments such as castors 43 for carrying the apparatus, level adjustors 44 for controlling the horizontal level of the apparatus, and an operating panel with switchboard 45. An adjusting mechanism 76 for controlling the distance and clearance between the cleaning rollers 11 is connected to each shaft 19 of the rollers 11. If an operator rotates a handle 79, a screw rod 78 moves up and down by means of a worm gear mechanism thereby adjusting the distance between the rollers 11. The cleaning rollers 11 are driven by a variable speed motor 61, and feed rollers 15 are driven by a variable speed motor 62. The hose ducts 72 and 73 communicate with a junction chamber 74 which leads to the turbo blower 20. A hose duct 63 is connected between the turbo blower 20 and a plenum chamber 64 which is assembled to the HEPA filter 22 by way of a prefilter 65 (FIG. 3). At the downstream side of the HEPA filter 22 a distribution chamber 67 is assembled for supplying new clean air to hose ducts 68 and 69.

Figure 2:
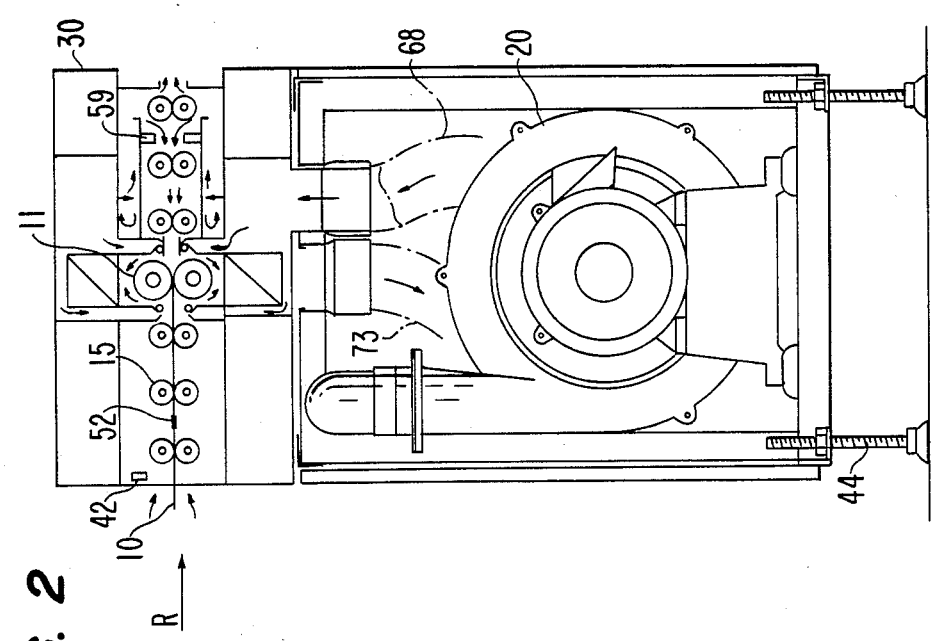
FIG. 2 is a vertical sectional view taken along the lines II—II of FIG. 1.

In FIG. 2, there is shown a beam switch 42 which detects an entering of the plate 10 into the apparatus. In this embodiment six pairs of feed rollers 15 are disposed along the passageway of the plate 10. Between the first pair of feed rollers and the second pair of feed rollers a static electricity eliminating brush 52 is disposed so as to prevent an electrostatic charge from being loaded on the plate 10. The brush 52 contacts with lateral edges of the plate 10 and removes particles of dust. Between the fifth pair of feed rollers and the sixth pair of feed rollers 15, a pair of corona discharge electrodes 59 are disposed so as to prevent an electrostatic charge from being loaded on the plate 10.

In FIG. 3, the distribution chamber 67 is provided with an exhausting hole 75 and a heater 77 for preheating the emitting air so as to prevent a temperature of the plate from going down.

In FIG. 4, outside the suction chambers 24 and 25 air supply chambers 53 and 55 are arranged so as to provide air toward the first and second pairs of nozzles 12 and 13. The clean zone 14 is divided into a central clean chamber 71 and expansion chambers 57 which are provided with expansion holes 70 at the wall thereof.

FIG. 5 shows air flow directions in the first embodiment of the invention. All elements contained in FIG. 5 are illustrated in FIGS. 1 to 4.

The operation of the apparatus of the first embodiment is described following particularly with reference to FIG. 4.

A plate 10 to be cleaned is admitted into the housing 30 of the apparatus along the direction R. When the plate passes through the inlet portion of the housing 30 the beam switch 42 detects the entering of the plate and the variable speed motors 61 and 62 start in motion whereby the rollers 11 and 15 are driven to the direction u.

First, the lateral edges of the plate 10 are rubbed by the brush 52 and particles of dust sticking to the edges are removed.

The high speed air emitting nozzles 12 are inclined at 45 degrees angle relative to the plate 10, and from the nozzles high speed air streams G at a velocity of about 80 meters per second are directed to the surfaces of the plate thereby blowing away the dust off the plate. At the same time, additional air g having a volume of 20 percent of the air stream G is induced from the upstream side of the plate 10.

Then, the plate 10 reaches the cleaning rollers 11 which are rotating at a circumferential tangential speed faster than that of the feed rollers 15, so that a relative speed is effected between the surface of the cleaning rollers 11 and that of the plate 10. Thus, the surfaces of the plate 10 are rubbed by the cleaning rollers 11 and particles of dust sticking to the surfaces are removed. It is preferable to select and determine the rotating speed of the rollers 11 and 15 so as to obtain most effective results corresponding to the kind of the plate. If a thickness of the plate varies, the contact pressure between the cleaning roller and the plate changes thereby causing a fluctuation of cleaning results. In response to the case, an operator can control the distance and clearance between the cleaning rollers 15 through a manual handling of the adjusting mechanism 76 (FIG. 1).

While the plate 10 passes through the cleaning rollers 11, high speed air streams H at a velocity of about 80 meters per second are directed to the surfaces of the plate from the nozzles 13 which are inclined at 45 degrees angle relative to the plate 10, thereby blowing away the dust off the plate. At the same time, additional air h having a volume of about 20 percent of the air streams H is induced from the downstream side of the plate 10. These high speed air streams G and H together with the induced air g and h are introduced into the suction chambers 24 and 25, and then supplied to the junction chamber 74 by way of the hose ducts 72 and 73 (FIG. 5). The junction chamber 74 is connected to the blower 20 which advances the air stream through the plenum chamber 64, prefilter 65, HEPA filter 22 and distribution chamber 67. After the distribution chamber 67, air stream is divided into two streams toward passages 68 and 69, and then two air streams are supplied into the air supply chambers 53 and 55 which include the high speed air nozzles 12 and 13.

A portion of the air admitted into the suction chambers 24 and 25 enters into the expansion chambers 57 through the expansion holes 70 at a velocity of substantially the same as the air stream emitted from the nozzles 12 and 13, and then becomes a gentle breeze at a velocity of about 0.5 meter per second on account of expansion and divergence. The gentle breeze advances from the expansion chambers 57 to the clean chamber 71, but a portion of the gentle breeze is exhausted from the outlet 18 of the housing 30. If the apparatus is accommodated within a clean room, it is not inconvenient for external air to be admitted into the housing 30 from the outlet 18. The air introduced into the clean chamber 71 becomes the air stream h, which is induced by the high speed air stream H and directed toward the cleaning rollers 11. On the other hand, a portion of an entering air stream I becomes the air stream g which is induced by the high speed air stream G and directed toward the cleaning roller 11.

It would be easily understood from FIG. 5 that an exhaust air stream EX1 going out of the distribution chamber 67 through the hole 75 and an exhaust air stream EX2 going out of the housing 30 through the outlet 18 permit external air to admit into the housing 30 based upon the balance of air volume. If the exhaust air EX1 is not prepared, there is a possibility that the induced air streams g and h cause a countercurrent flow due to a lack of escaping air volumes. Accordingly, it is relatively important to locate the exhausting hole 75 at the wall of the distribution chamber 67. Because the entering air stream I is accelerated by the induced air stream g, an intermediate speed duct is formed immediately before the nozzle 12, so that an air escaping problem in prior art that a portion of the high speed air stream after blowing away the dust off the plate escapes from the housing and contaminates external atmosphere can be effectively prevented. A countercurrent flow of the dust is not produced and the dust is introduced into the suction chambers 24 and 25 with the aid of moving energy of the air stream from the nozzle 12. At the downstream side of the plate 10, the induced air stream h is flowing from the clean chamber 71 to the nozzles 13, so that a countercurrent flow of the dust toward the clean chamber and exterior can be effectively prevented.

With the above arrangement utilizing the expansion holes, expansion chambers and induced air streams, there is no need for another fan or blower to produce a gentle breeze air flow.

Since the cleaning rollers 11 and the high speed air nozzles 12 and 13 are disposed adjacent each other without feed rollers between them and a countercurrent flow is prevented by the induced air stream h, the dust circulation problem in prior art that a particle of dust removed by the cleaning roller circulates and stickes to the plate again can be effectively eliminated.

Some kinds of plate tend to become charged with static electricity in the cleaning process. For the purpose of eliminating a sticking of a dust to the plate due to the static electricity, the corona discharge electrodes 59 are disposed. Since a corona discharge electrode has a tendency of collecting a dust like an electrical dust collecter, in the embodiment of FIG. 4, the corona discharge electrodes 59 are positioned within the clean chamber 71 which is filled with clean air passed through the HEPA filter. Thus, a sticking of a dust to the electrodes 59 is considerably diminished. Furthermore, the induced air flow h from the clean chamber 71 contains an ionic flow after passing through the electrodes 59, so that the static electricities loaded on the cleaning rollers 11 and the plate 10 are eliminated by the ionic flow, thereby the dust removing action being promoted.

By reason of a productive process, some plates are admitted into the housing keeping at a heated condition. The plate cleaning apparatus, however, has a problem that a high speed air stream cools down the surface of the plate. In response to the problem, the heater 77 (FIG. 3) is disposed inside the distribution chamber 67 in such a way that the heater 77 can raise the temperature of the air supplied to the high speed air nozzles 12 and 13.

Several modifications of the apparatus are possible. The cleaning roller 11 is preferably detachably mounted by the driving shaft 19 in such a way that an exchanging handling of a new roller or other cleaning parts can be easily completed.

It is also preferable to make the feed roller 15 of a rubber material having electrical conductivity so as to provide an earth circuit for removing static electricity on the plate.

Figure 6:
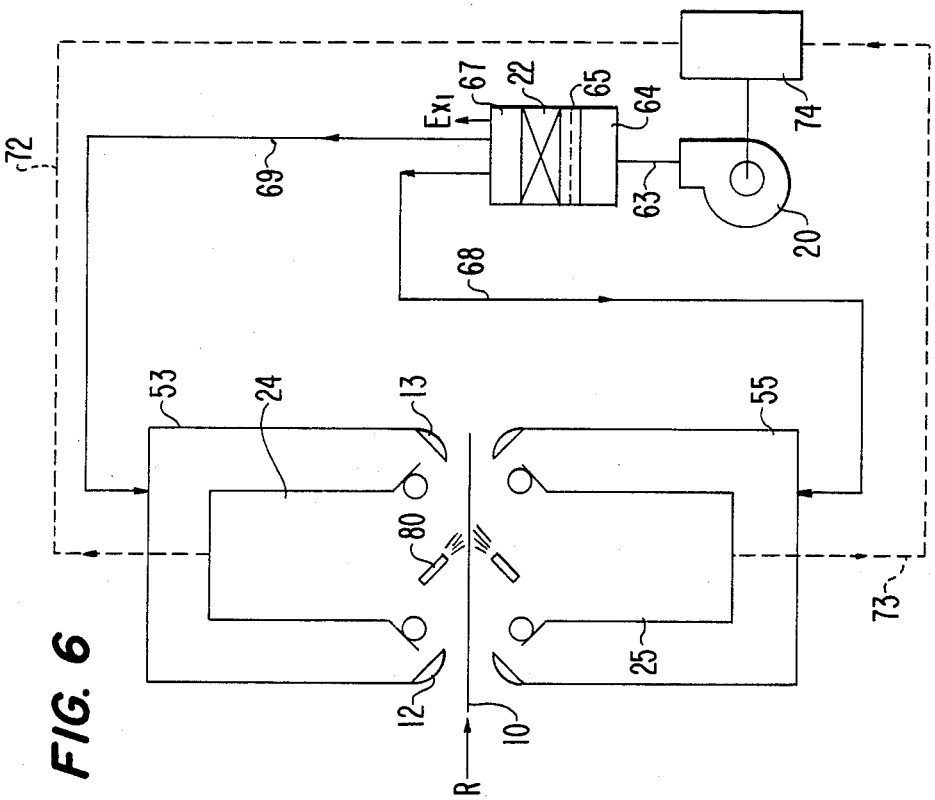
FIG. 6 is an air flow diagram of a second embodiment of the plate cleaning apparatus according to the invention.

FIG. 6 shows an air flow diagram of an alternative embodiment of the invention. In this arrangement, a pair of fixed cleaning brushes 80 having electrical conductivities are substituted for the cleaning rollers 11. Other elements in FIG. 6 are the same as in the first embodiment in FIGS. 1 to 5.

Figure 7:
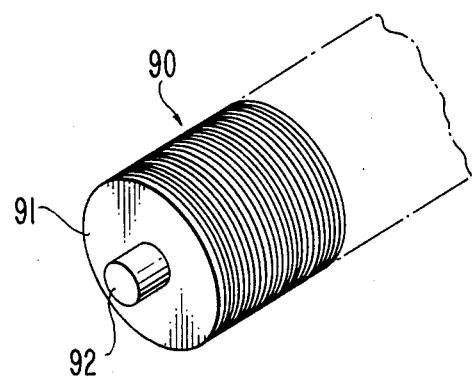
FIG. 7 is a fragmentary perspective view of a cleaning roller according to the invention.

Another aspect of the present invention is directed to a new construction of the cleaning roller. In FIG. 7, the cleaning roller 90 of the invention comprises a plurality of thin discs of nonwoven fabric 91 bonded side by side with adhesive 93 therebetween, and a longitudinal shaft 92 extending through central holes provided in the thin discs. The adhesive 93 has substantially the same softness before it is applied to the nonwoven fabric 91. An example of such adhesive is a TYPE ML-20 made by Japan Vilene Co., Ltd. in Japan. The shaft 92 and the nonwoven fabric 91 are bonded together by the adhesive 93.

Figure 8:
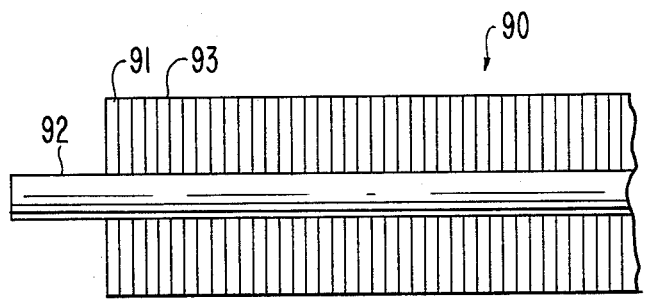
FIG. 8 is a fragmentary sectional view of the roller before it is used.

FIG. 8 illustrates a sectional construction of the cleaning roller 90 before it is used. It should be noted that there is no rubber core between the nonwoven fabric 91 and the shaft 92. Since there is no rubber core the whole surface of the roller 90 preserves the softness of the nonwoven fabric itself. As a result, when the roller contacts with a plate the friction therebetween is considerably diminished as compared with prior art. With the exception of the shaft 92, the roller 90 is composed of nonwoven fabric from its surface to the core, so that a thickness of the nonwoven fabric contributes to an extension of the life. Since the external surface is formed by a plurality of thin discs, there is an advantage that the dust sticking to the surface scarcely falls off.

Figure 9:
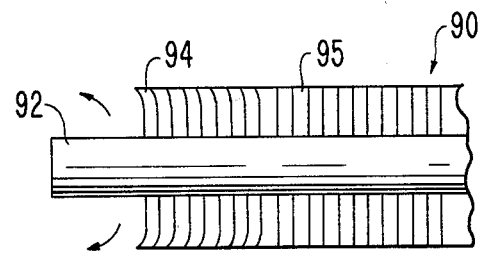
FIG. 9 is a fragmentary sectional view of the roller after it is used.

FIG. 9 illustrates a sectional construction of the cleaning roller 90 after it is used. As shown in this figure, the external surface is compressed and deformed, but the even cylindrical configuration is still maintained because only outer discs 94 are subjected to a buckling and inner discs 95 can escape from the buckling. Therefore, even if another plate having a different width to be cleaned is supplied to the cleaning roller 90, a flat cleaning action is continuously maintained.

While there have been shown and described preferred embodiments, it is to be understood that various other adaptations and modifications may be made within the skill of the art for use with particular applications, without departing from the spirit and scope of the invention.

I claim:

1. In a cleaning roller adapted for use in a plate cleaning apparatus arranged in a production line of miscellaneous plates, the improvement comprising;
    a plurality of thin discs of nonwoven fabric bonded side by side with adhesive therebetween, said adhesive having substantially the same softness before it is applied to the nonwoven fabric, and
    a longitudinal shaft extending through central holes provided in said thin discs,
    said shaft and said nonwoven fabric being bonded together by said adhesive.

* * * * *

UNITED STATES PATENT AND TRADEMARK OFFICE
CERTIFICATE OF CORRECTION

PATENT NO. : 4,799,284
DATED : January 24, 1989
INVENTOR(S) : Masao TORIWAKI et al.

It is certified that error appears in the above-identified patent and that said Letters Patent is hereby corrected as shown below:

On The Title Page:

[73] Assignee: Toyo Netsu Kogyo Kaisha, Ltd.

should read:

-- [73] Assignee: (1) Hakuto Co., Ltd.
Tokyo, Japan
(2) Toyo Netsu Kogyo Kaisha, Ltd.
Tokyo, Japan --.

Signed and Sealed this

Tenth Day of October, 1989

Attest:

DONALD J. QUIGG

Attesting Officer

Commissioner of Patents and Trademarks